(12) United States Patent
Komatsu et al.

(10) Patent No.: US 10,491,194 B2
(45) Date of Patent: Nov. 26, 2019

(54) FILTER DEVICES HAVING REDUCED SPURIOUS EMISSIONS FROM LAMB WAVES

(71) Applicant: SKYWORKS FILTER SOLUTIONS JAPAN CO., LTD., Kadoma-Shi (JP)

(72) Inventors: Tomoya Komatsu, Irvine, CA (US); Joji Fujiwara, Suita (JP)

(73) Assignee: SKYWORKS FILTER SOLUTIONS JAPAN CO., LTD., Kadoma-Shi (JP)

( * ) Notice: Subject to any disclaimer, the term of this patent is extended or adjusted under 35 U.S.C. 154(b) by 0 days.

(21) Appl. No.: 16/247,646

(22) Filed: Jan. 15, 2019

(65) Prior Publication Data

US 2019/0149132 A1     May 16, 2019

Related U.S. Application Data

(63) Continuation of application No. 15/608,164, filed on May 30, 2017, now Pat. No. 10,187,039.

(Continued)

(51) Int. Cl.
*H03H 9/64* (2006.01)
*H03H 9/72* (2006.01)
*H03H 9/02* (2006.01)

(52) U.S. Cl.
CPC ...... *H03H 9/6496* (2013.01); *H03H 9/02866* (2013.01); *H03H 9/6403* (2013.01); *H03H 9/6483* (2013.01); *H03H 9/725* (2013.01)

(58) Field of Classification Search
CPC ...... H03H 9/0222; H03H 9/25; H03H 9/6406; H03H 9/725

(Continued)

(56) References Cited

U.S. PATENT DOCUMENTS 6,516,503 B1   2/2003   Ikada et al.
7,741,931 B2   6/2010   Matsuda et al.
(Continued)

FOREIGN PATENT DOCUMENTS

JP        2000068784 A        3/2000

OTHER PUBLICATIONS

Abbott et al., "Theoretical Investigation into Spurious Modes Content in SAW Devices with a Dielectric Overcoat," Fourth International Symposium on Acoustic Wave Devices for Future Mobile Communication Systems, Mar. 3-5, 2010, pp. 193-203).

*Primary Examiner* — Dean O Takaoka
(74) *Attorney, Agent, or Firm* — Lando & Anastasi, LLP

(57) ABSTRACT

A filter device including a first filter having a first passband, and a second filter having a second passband, the first and second filters each being connected between a common contact and a respective signal contact, and the filter device configured to reduce spurious emissions generated in one filter due to propagation of Lamb waves in the other filter. In one example the first filter includes a SAW filter formed on a piezoelectric substrate, a SAW resonator formed on the piezoelectric substrate and connected in series between the common contact and the SAW filter, and a dielectric film formed over the piezoelectric substrate covering the SAW filter and the SAW resonator. The dielectric film has a first thickness over the SAW filter and a second, lesser, thickness over the SAW resonator, a difference between the first and second thicknesses being selected to suppress spurious emissions in the second passband generated by propagation of a Lamb wave in the SAW filter.

20 Claims, 6 Drawing Sheets

Related U.S. Application Data

(60) Provisional application No. 62/503,557, filed on May 9, 2017, provisional application No. 62/346,838, filed on Jun. 7, 2016.

(58) Field of Classification Search
USPC .......................................... 333/133, 193–196
See application file for complete search history.

(56) References Cited

U.S. PATENT DOCUMENTS

| | | |
|---|---|---|
| 8,354,896 B2 | 1/2013 | Matsuda et al. |
| 8,692,630 B2 | 4/2014 | Reinhardt et al. |
| 9,203,376 B2 | 12/2015 | Tsurunari et al. |
| 9,467,117 B2 | 10/2016 | Fujiwara et al. |
| 10,044,340 B2 | 8/2018 | Fujiwara et al. |
| 2013/0162368 A1 | 6/2013 | Tsurunari et al. |
| 2015/0270824 A1 | 9/2015 | Sauer et al. |

FILTER DEVICES HAVING REDUCED SPURIOUS EMISSIONS FROM LAMB WAVES

CROSS-REFERENCE TO RELATED APPLICATIONS

This application is a continuation of and claims the benefit under 35 U.S.C. § 120 of co-pending U.S. application Ser. No. 15/608,164 titled "FILER DEVICES HAVING REDUCED SPURIOUS EMISSIONS FROM LAMB WAVES" and filed on May 30, 2017, which claims the benefit under 35 U.S.C. § 119(e) of U.S. Provisional Application No. 62/346,838, titled "FILTER DEVICES," filed on Jun. 7, 2016, and U.S. Provisional Application No. 62/503,557, titled "FILTER DEVICES HAVING REDUCED SPURIOUS EMISSIONS FROM LAMB WAVES," filed on May 9, 2017, each of which is herein incorporated by reference in its entirety for all purposes.

BACKGROUND

Conventionally, in a communication device such as a mobile phone and the like, a filter device has been used to separate signals having different bands, such as transmission and reception signals, for example. In such a filter device, one or more surface acoustic wave (SAW) elements are often used. These SAW elements can include one or more resonators, each formed by an interdigital transducer (IDT) electrode disposed on a piezoelectric substrate. The IDT electrode includes two comb-shaped electrodes that interdigitate with one another. In particular, such SAW elements also including a silicon dioxide film covering a piezoelectric substrate made of lithium niobate or lithium tantalate have been used in the development and design of SAW filters and duplexers for application to the cellular handset market. The piezoelectric substrate and the silicon dioxide film cooperate with each other for temperature compensation to provide better temperature characteristics for the SAW elements.

The acoustic modes present in such IDT-based SAW elements include Lamb waves that propagate in the silicon dioxide film. These Lamb waves can cause spuriousness in the frequency characteristics of the SAW element. It has been analytically proven that characteristics of the Lamb waves, such as resonant frequency, coupling, etc., are dependent on the thickness of the silicon dioxide film. In particular, it has been shown (see, for example, Ben Abbott, Robert Aigner, Alan Chen, Kevin Gamble, Julien Gratier, Taeho Kook, Marc Solal, Kurt Steiner, "THEORETICAL INVESTIGATION INTO SPURIOUS MODES CONTENT IN SAW DEVICES WITH A DIELECTRIC OVERCOAT," Fourth International Symposium on Acoustic Wave Devices for Future Mobile Communication Systems, Mar. 3-5, 2010, pp.193-203) that to suppress the Lamb waves the thickness of the silicon dioxide film must be restricted to less than a certain amount. However, this requirement can be inconsistent with other design considerations for various SAW elements.

For example, certain SAW filters can have a ladder-type configuration including a plurality of series-arm resonators and a plurality of parallel-arm resonators, as shown in FIG. 1, for example, and discussed further below. One technique for suppressing suppress frequency fluctuations in the characteristics of one or more of the series-arm resonators is to increase the film thickness of a dielectric film formed on an area of the series-arm resonator(s), as disclosed in U.S. Patent Application Publication No. 2013/0162368, for example. Another technique involves changing the thicknesses of the dielectric films over the series-arm resonator(s) of different stages of a SAW filter, as disclosed in Japanese Patent Publication No. 2000-068784, for example. Further, U.S. Patent Application Publication No. 2015/0270824 discloses a technique for separating the frequency of a secondary mode in an electroacoustic device from the frequency of the main mode by changing the film thicknesses of a separating film in the device.

FIG. 1 shows an example of conventional filter device 100 formed by SAW elements. The filter device 100 includes a first filter 110 having a first passband and a second filter 120 having a second passband different from the first passband. The first filter 110 is connected between a common contact 101, which can be connected to an antenna, and a first signal contact 102. The second filter 120 is connected between the common contact 101 and a second signal contact 103. In the first filter 110, series resonators 111, 112, 113 and parallel resonators 114, 115 form a ladder-type filter. Similarly, in the second filter 120, series resonators 121, 122, 123 and parallel resonators 124, 125 form another ladder-type filter. Each of these series resonators 111, 112, 113, 121, 122, 123 and parallel resonators 114, 115, 124, 125 is a SAW element.

FIG. 2 is a graph illustrating signal reflectivity (as a function of normalized frequency) of the first conventional filter 110 presented at the common contact 101. The first filter 110 has a passband 132. In the first filter 110, a spurious emission 136 may appear in a band 134 that includes the frequency range 1.2 to 1.4 times greater than the center frequency f0 of the passband 132. The spurious emission 136 results from a Lamb wave occurring in the silicon dioxide film of the SAW element forming the first filter 110.

SUMMARY OF INVENTION

When the frequency of a spurious emission 136 due to a Lamb wave in the first filter 110 of the filter device 100 is within a passband of the second filter 120, the spurious emission 136 may undesirably degrade separation characteristics for signals included in the passband of the second filter 120.

Aspects and embodiments provide a filter device configured to solve one or more of the aforementioned problems. In particular, certain embodiments are directed to a filter device including at least two SAW filters and configured to reduce spurious emissions generated in a passband of one SAW filter due to a Lamb wave that propagates in the silicon dioxide film of a SAW element forming another SAW filter of the device.

According to one embodiment, the filter device includes a common contact connected to an antenna, a first signal contact, a second signal contact, a first filter connected between the common contact and the first signal contact and having a first passband, and a second filter connected between the common contact and the second signal contact and having a second passband different from the first passband. The first filter includes a first piezoelectric substrate, a first SAW resonator connected in series on a side of the common contact in the first filter, a first SAW filter connected between the first SAW resonator and the first signal contact, and a first dielectric film formed on the first piezoelectric substrate to cover the first filter, a film thickness of the first dielectric film in an area corresponding to the first SAW resonator being less than a film thickness of the first dielectric film in an area corresponding to the first SAW filter, and, a center frequency of the second passband being configured as a frequency 1.2 to 1.4 times greater than a center frequency of the first passband.

According to one embodiment the filter device comprises a common contact, a first signal contact, and a second signal contact. The filter device further includes a first filter connected between the common contact and the first signal contact and having a first passband, the first filter including a first piezoelectric substrate, a surface acoustic wave (SAW) filter formed on a surface of the first piezoelectric substrate, a SAW resonator formed on the surface of the first piezoelectric substrate and connected in series between the common contact and the SAW filter, and a dielectric film formed over the surface of the piezoelectric substrate and covering the SAW filter and SAW resonator, the dielectric film having a first thickness in a first region corresponding to the SAW filter and a second thickness in a second region corresponding to the SAW resonator, the first thickness being greater than the second thickness. The filter device further include a second filter connected between the common contact and the second signal contact and having a second passband different from the first passband, a center frequency of the second passband being in a range of 1.2 to 1.4 times greater than a center frequency of the first passband.

In one example the SAW resonator and the SAW filter together form a first ladder-type filter, the SAW filter including at least one parallel resonator connected to a ground contact. In another example the SAW filter is a double mode SAW filter.

In one example the center frequency of the second passband is in a range of 1.25 to 1.3 times greater than the center frequency of the first passband.

In one example the dielectric film is made of silicon dioxide. In one example the second thickness of the dielectric film in the second region corresponding to the SAW resonator is configured to be less than 26% when normalized with a wavelength of an excited surface acoustic wave in the first filter. In another example the first thickness of the dielectric film in the first region corresponding to the SAW filter is configured to be greater than 29% when normalized with a wavelength of an excited surface acoustic wave in the first filter. In another example a difference between the first thickness and the second thickness of the dielectric film is configured to be greater than 3% when normalized with a wavelength of an excited surface acoustic wave in the first filter.

In one example the first piezoelectric substrate is made of lithium niobate. In another example the first piezoelectric substrate is made of lithium tantalate.

In one example the second filter includes a plurality of acoustic wave elements disposed on the first piezoelectric substrate. In another example the second filter includes a second piezoelectric substrate. The second filter may include a plurality of acoustic wave elements disposed on the second piezoelectric substrate. In one example the first piezoelectric substrate is made of a first material and the second piezoelectric substrate is made of a second material different from the first material.

Further embodiments are directed to a module comprising the filter device.

Still further embodiments are directed to a wireless device comprising the filter device. The filter device may be configured as an antenna duplexer or antenna diplexer in the wireless device, for example.

According to another embodiment a filtering module comprises a packaging substrate, and a filter die disposed on the packaging substrate and having a common contact, a first signal contact, and a second signal contact. The filter die includes a first filter connected between the common contact and the first signal contact and having a first passband, the first filter including a piezoelectric substrate, a surface acoustic wave (SAW) filter formed on a surface of the piezoelectric substrate, a SAW resonator formed on the surface of the piezoelectric substrate and connected in series between the common contact and the SAW filter, and a dielectric film formed over the surface of the piezoelectric substrate and covering the SAW filter and the SAW resonator, the dielectric film having a first thickness in a first region corresponding to the SAW filter and a second thickness in a second region corresponding to the SAW resonator, the first thickness being greater than the second thickness, the filter die further including a second filter connected between the common contact and the second signal contact and having a second passband different from the first passband, a center frequency of the second passband being in a range of 1.2 to 1.4 times greater than a center frequency of the first passband. The filtering module further comprises a plurality of connection pads disposed on the packaging substrate, the common contact, the first signal contact, and the second signal contact of the filter die being connected to corresponding ones of the plurality of connection pads by respective electrical connectors.

In one example the electrical connectors are wirebonds. In another example the electrical connectors are solder bumps.

In one example the center frequency of the second passband is in a range of 1.25 to 1.3 times greater than the center frequency of the first passband.

In one example the dielectric film is made of silicon dioxide.

According to certain embodiments, a filter device may be provided to reduce the spurious emission generated in a band of a frequency 1.2 to 1.4 times greater than the center frequency of the passband for a first filter in the device due to a Lamb wave that occurs depending on the silicon dioxide film of the SAW element forming the first filter. Therefore, quality of a communications device in which the filter device is used may be improved.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments provide filter device that reduces a spurious emission of a first filter generated in a band of a frequency 1.2 to 1.4 times greater than a center frequency of a passband of the first filter.

Figure 1:
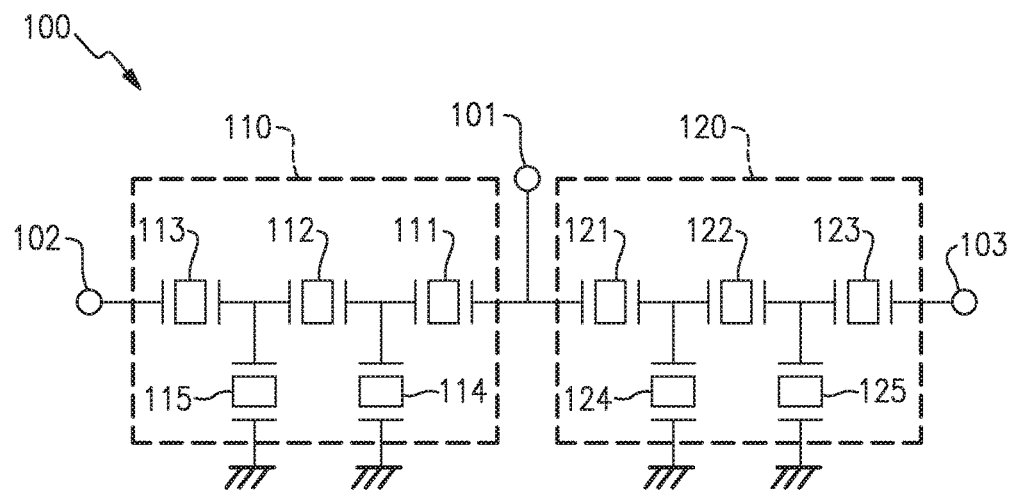
FIG. 1 is a circuit diagram illustrating a conventional filter device.
Figure 2:
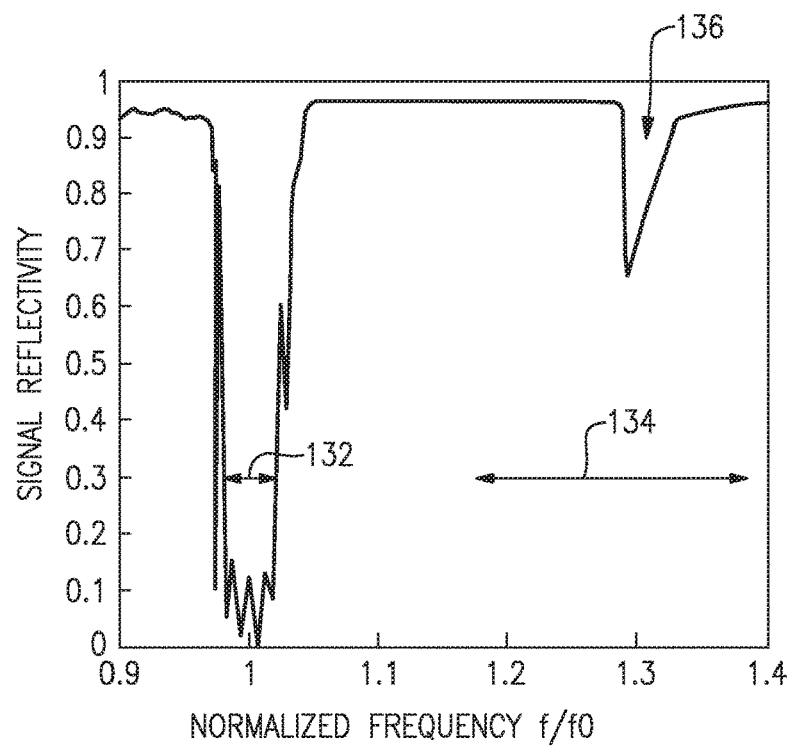
FIG. 2 is a graph illustrating frequency characteristics of a first filter of the conventional filter device of FIG. 1.
Figure 3:
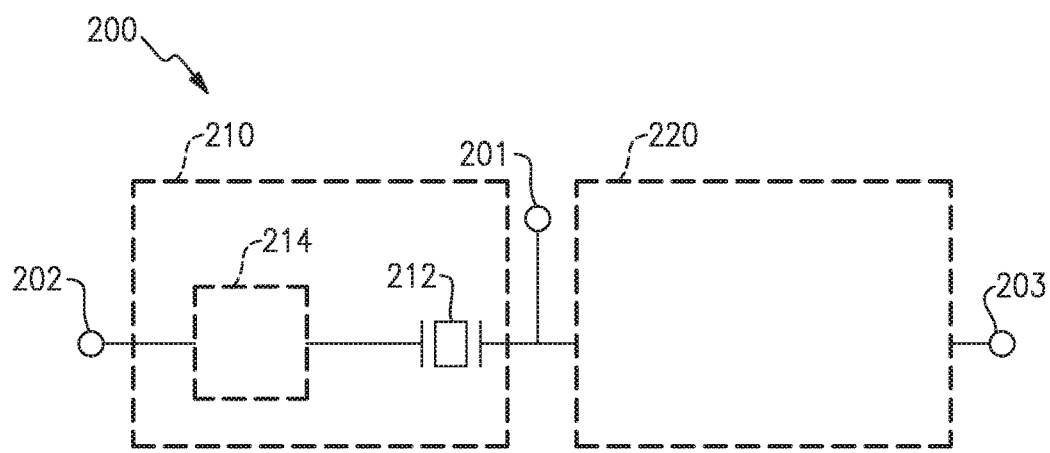
FIG. 3 is a circuit diagram illustrating a configuration of an example of a filter device according to aspects of the present disclosure.

FIG. 3 is a block diagram schematically illustrating an exemplary configuration of a filter device according to certain embodiments. The filter device 200 includes a first filter 210 and a second filter 220. The first filter 210 is connected between a common contact 201, which can be connected to an antenna, and a first signal contact 202 to allow an input signal to pass through. The second filter 220 is connected between the common contact 201 and the second signal contact 203. The filter device 200 may be an antenna diplexer or antenna duplexer, for example.

The first filter 210 includes a plurality of surface acoustic wave (SAW) resonators. Only one SAW resonator 212 of the plurality of resonators (referred to as a front-end resonator hereinafter) is connected to the common contact 201. The remaining resonators (not shown) forming a SAW filter 214 are connected between the front-end resonator 212 and the first signal contact 202 within the first filter 210.

In one example, the front-end resonator 212 and the SAW filter 214 included in the first filter 210 may form a ladder-type filter, which includes a plurality of series resonators (including the front-end resonator 212) connected in series with one another between the common contact 201 and the first signal contact 202, and one or more parallel resonators connected between these series resonators and a ground contact (not shown). However, the configuration of the SAW filter 214 is not limited to a ladder-type arrangement, and in other embodiments the SAW filter 214 may be a double mode SAW (DMS) filter, for example.

According to certain examples the second filter 220 has a passband different from that of the first filter 210. In one embodiment, the center frequency of the second filter 220 may be within a band of approximately 1.2 to 1.4 times greater than the center frequency of the passband of the first filter 210. The center frequency of the second filter 220 may be in a band of approximately 1.25 to 1.3 times greater than the center frequency of the passband of the first filter 210.

Figure 4A:
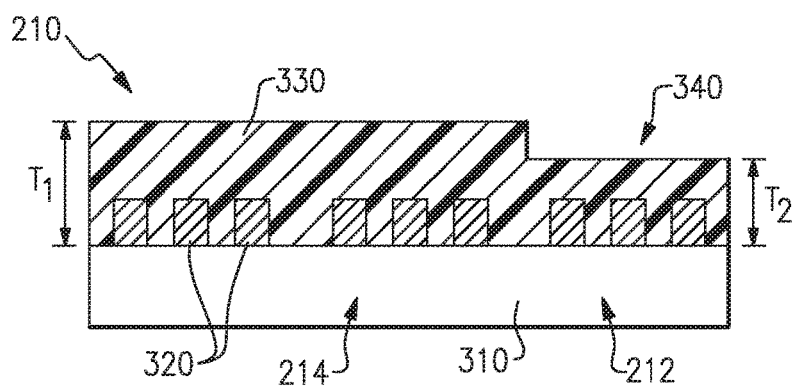
FIG. 4A is a cross sectional view showing a configuration of a filter device according to aspects of the present disclosure.

FIG. 4A is a simplified cross-sectional view showing the structure of an example of the first filter 210. In this example, the first filter 210 includes a piezoelectric substrate 310 having a flat main surface. The piezoelectric substrate 310 is formed by a piezoelectric body such as lithium niobate or lithium tantalate, for example. Each of the SAW resonators forming the SAW filter 214 and the front-end SAW resonator 212 includes an interdigital transducer (IDT) electrode formed of a pair of interdigitated comb-shaped electrodes. Accordingly, FIG. 4A schematically shows IDT electrodes 320 representing the SAW filter 214 and the front-end resonator 212. The IDT electrodes 320 are formed on the main surface of the piezoelectric substrate 310.

As shown in FIG. 4A, the main surface of the piezoelectric substrate 310 as well as the IDT electrodes 320 are covered with a dielectric film 330. In one example the dielectric film 330 is made of silicon dioxide ($SiO_2$). In one embodiment, the dielectric film has a first thickness $T_1$ in a first region corresponding to the SAW filter 214, and a second thickness $T_2$ in a second region 340 corresponding to the front-end resonator 212. The second thickness $T_2$ is configured to be less than the first thickness $T_1$. As described further below, configuring the film thickness $T_2$ of the dielectric film 330 in the region 340 corresponding to the front-end resonator 212 to be relatively smaller can prevent the occurrence of a Lamb wave, such that spurious emissions may be reduced in the passband of the second filter 220.

According to certain embodiments, the second filter 220 can also include a plurality of SAW resonators. The plurality of resonators included in the second filter 220 can be formed on the main surface of the piezoelectric substrate 310 adjacent to the resonators forming the first filter 210, for example. In addition, the dielectric film 330 can be formed covering each of the plurality of resonators included in the second filter 220. The dielectric film 330 may have the first thickness $T_1$ in the region(s) corresponding to the second filter 220. It is to be appreciated that the second filter 220 need not necessarily be formed together with the first filter 210 on the main surface of the piezoelectric substrate 310. In certain embodiments the second filter 220 may be formed on a piezoelectric substrate different than the piezoelectric substrate 310 of the first filter 210. Further, the second filter need not necessarily be formed by SAW elements. In other embodiments, the second filter 220 can include bulk acoustic wave (BAW) resonators or film bulk acoustic resonators (FBARs), for example.

Figure 4B:
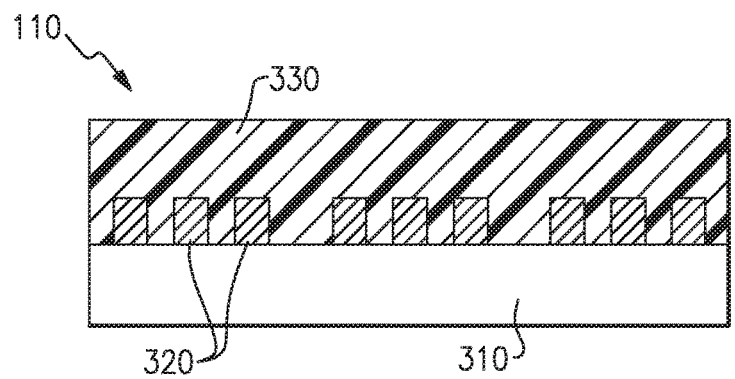
FIG. 4B is a cross sectional view showing a conventional filter.

FIG. 4B is a cross-sectional view showing the conventional first filter 110 to be compared with the example of the first filter 210 shown in FIG. 4A. Reference numerals common with the example shown in FIG. 4A indicate like elements in FIG. 4B for clarifying the correspondence relationship therebetween. The conventional first filter 110 is configured to include the dielectric film 330 having a constant film thickness over all IDT electrodes 320 forming the resonators of the first filter 110. Accordingly, an undesirable Lamb wave may occur depending on the film thickness of the dielectric film 330, as discussed above.

Figure 5:
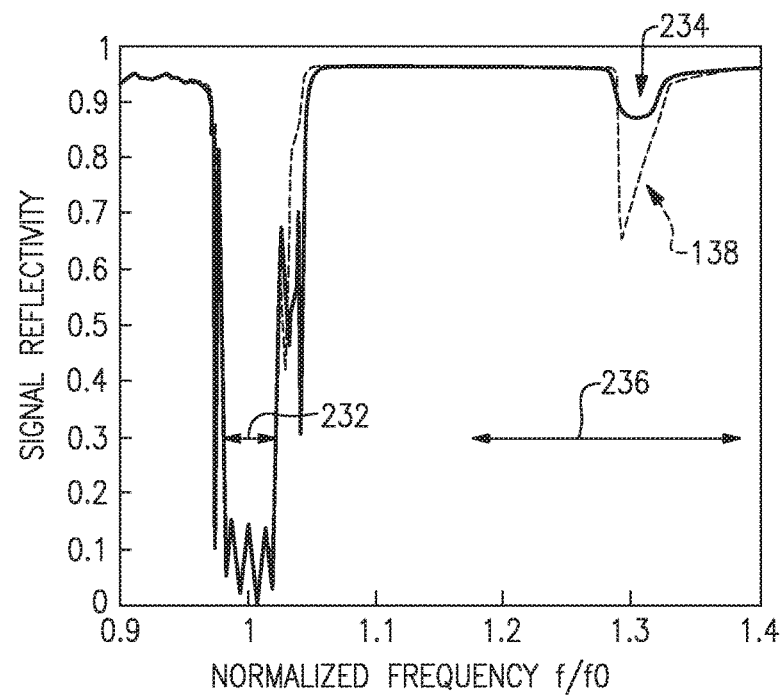
FIG. 5 is a graph illustrating frequency characteristics of a first filter of a filter device according to aspects of the present disclosure.

FIG. 5 is a graph illustrating signal reflectivity at the common contact 201 of the first filter 210, as indicated by a solid line, as a function of normalized frequency. Thus, the signal reflectivity is shown on the vertical axis of the graph, and the horizontal axis of the graph represents the normalized frequency f/f0 relative to a center frequency f0 in a passband 232 of the first filter 210. A spurious emission 234 appears in a frequency band 236 that extends over a range approximately 1.2 to 1.4 times greater than the center frequency f0 in the passband 232 of the first filter 210. The spurious emission 234 is originated from a Lamb wave occurring in the silicon dioxide dielectric film 330 of the first filter 210.

Also shown in FIG. 5 is a spurious emission 138 generated in the band 236 by the conventional first filter 110 as indicated by a dashed line for comparison. As shown in FIG. 4B, the conventional first filter 110 is configured to include the dielectric film 330 having a constant film thickness over all resonators. In such a conventional first filter 110, the spurious emission 138 generated in the band 236 is not suppressed, such that the spurious emission 138 may be relatively large, as shown in FIG. 5.

In contrast, by configuring the film thickness of the dielectric film 330 in the first filter 210 according to certain embodiments to be reduced in the region corresponding to the front-end resonator 212 relative to the film thickness in other regions, as shown in FIG. 4A, the occurrence of the Lamb wave is suppressed. Thus, the spurious emission 234 in the band 136 is reduced, as shown in FIG. 5. Such a suppression of the spurious emission can ensure good passing characteristics for the filter 200 in the band 136, and therefore can improve performance for a communications device in which the filter device 200 is used.

Figure 6:
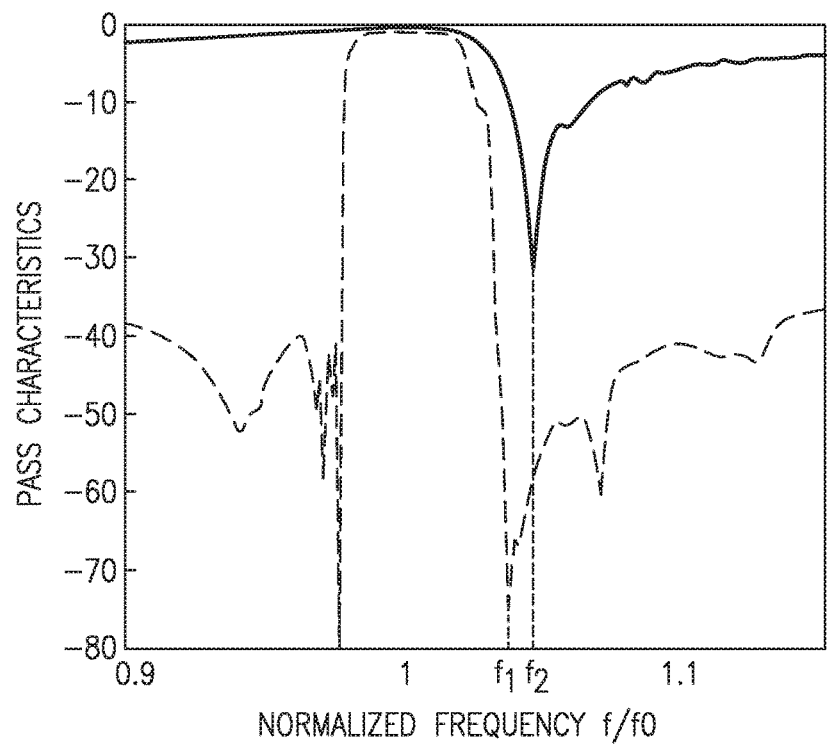
FIG. 6 is a graph illustrating frequency characteristics of a front-end resonator according to aspects of the present disclosure.

FIG. 6 is a graph illustrating frequency characteristics of the front-end resonator 212 of the first filter 210 according to the example shown in FIG. 4A. The horizontal axis of the graph represents the normalized frequency f/f0 relative to the center frequency f0 in the passband 132 of the first filter 210, and the vertical axis represents passing characteristics in decibels (dB). In FIG. 6, the dashed line indicates the passing characteristics of the first filter 210, whereas the solid line indicates those of the front-end resonator 212. The resonators of the first filter 210 are configured such that an antiresonant frequency f2 of the front-end resonator 212 is a frequency higher than and closest to a resonant frequency f1 of a resonator other than the front-end resonator 212. The resonant frequency f1 generates an attenuation pole in the first passband of the first filter 210.

In the first filter 210, configuring the film thickness of the dielectric film 330 in the region 340 of the front-end resonator 212 ($T_2$) to be less than the film thickness in the other regions ($T_1$) may increase an absolute value of the temperature coefficient of frequency (TCF) for the front-end resonator 212. Therefore, even when the antiresonant frequency of the front-end resonator 212 shifts toward the passband of the first filter 210 due to temperature changes, the passband may be prevented from narrowing.

Figure 7:
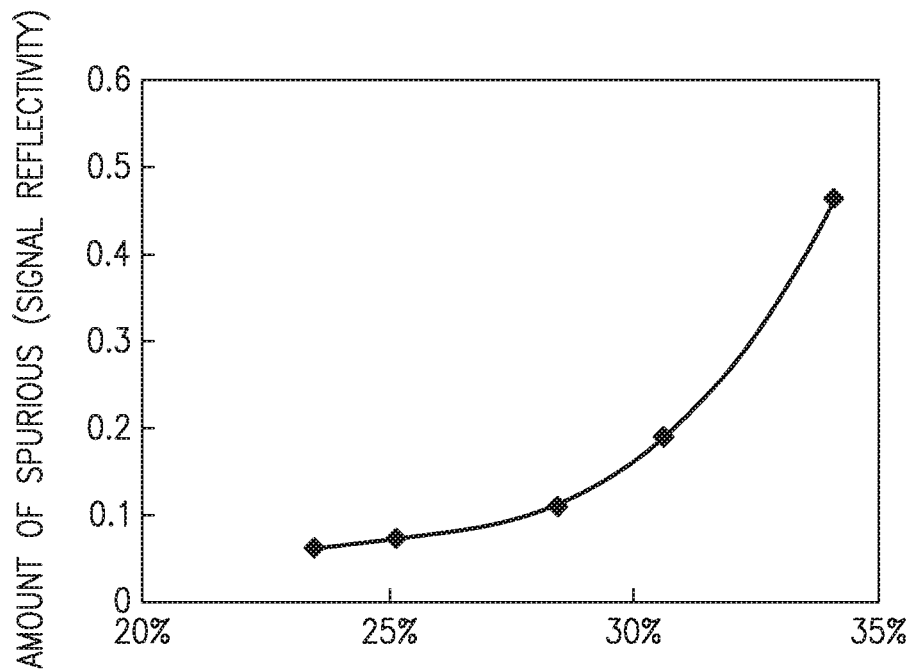
FIG. 7 is a graph illustrating a relationship between a normalized film thickness of a dielectric film and a level of a spurious emission according to aspects of the present disclosure.

FIG. 7 illustrates a relationship between the film thickness of the dielectric film 330 in the region 340 of the front-end resonator 212 and the level of the spurious emission 234.

Figure 8:
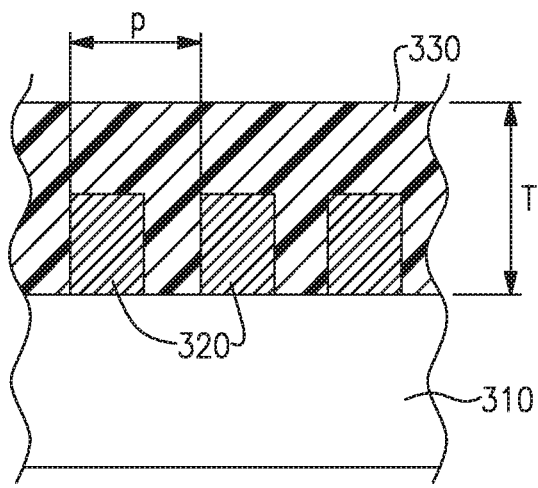
FIG. 8 is a cross sectional view showing a normalized film thickness according to aspects of the present disclosure.

FIG. 8 illustrates a normalized film thickness of the dielectric film 330. Specifically, FIG. 8 is an enlarged cross-sectional view of a portion of a resonator in the first filter 210. The IDT electrode 320 of the resonator has a pitch P, and the dielectric film 330 covering the piezoelectric substrate 310 and the IDT electrode 320 has a film thickness T with reference to the main surface of the piezoelectric substrate 310. The resonator is configured to excite a surface acoustic wave having a wavelength L=2P. The normalized film thickness of the dielectric film 330 can be represented as T/L relative to the wavelength L of the surface acoustic wave.

FIG. 7 shows that the level of the spurious emission 234 generated in the band 236 (FIG. 5) of the first filter 210 may depend on the normalized film thickness T/L of the dielectric film 330 in the region 340 corresponding to the front-end resonator 212. As can be seen with reference to FIG. 7, significantly less spuriousness is observed when the normalized film thickness is relatively low. In particular, the level of the spurious emission 234 is less than 0.1 in an area where the normalized film thickness T/L of the dielectric film 330 formed on the region 340 corresponding to the front-end resonator 212 is less than 26%. Further, it can be seen that in this area, variations in the level of the spurious emission 234 relative to the normalized film thickness T/L of the dielectric film 330 are smaller, and therefore the performance can be more stable.

In certain embodiments, the normalized film thickness T/L needs to be greater than 29% to ensure a better temperature coefficient of frequency (TCF) in a resonator other than the front-end resonator 212 that generates an attenuation pole closest to the passband 232 of the first filter 210, i.e., a resonator forming the passband 232 of the first filter 210 in the first filter 210.

Therefore, according to certain embodiments, the normalized film thickness T/L of the dielectric film 330 covering the front-end resonator 212 should be less than 26%, whereas the normalized film thickness T/L of the dielectric film 330 covering the other resonator should be greater than 29%. To this end, the normalized film thickness T/L of the dielectric film 330 in the region 340 corresponding to the front-end resonator 212 can be configured to be at least 3% less than the normalized film thickness T/L of the dielectric film 330 covering the other regions. Therefore, the occurrence of Lamb waves due to the dielectric film 330 in the region 340 corresponding to the front-end resonator 212 of the first filter 210 can be suppressed. This can reduce the level of the spurious emission 234 in the band 236 caused by the first filter 210 and also can maintain the temperature coefficient of frequency of the other resonators included in the SAW filter 214.

As discussed above, embodiments of the filter device 200 can be configured as a duplexer sharing an antenna for transmission and reception, or a diplexer dividing an antenna signal depending on its band, for example. Further, the filter device 200 according to certain embodiments is not limited to only the first filter 210 and the second filter 220, but may include three or more filters. In this case, any two filters can be configured as discussed above, with one filter having a reduced dielectric film thickness over its front-end resonator so as to suppress spurious emissions due to Lamb waves in the passband of another filter.

Figure 9:
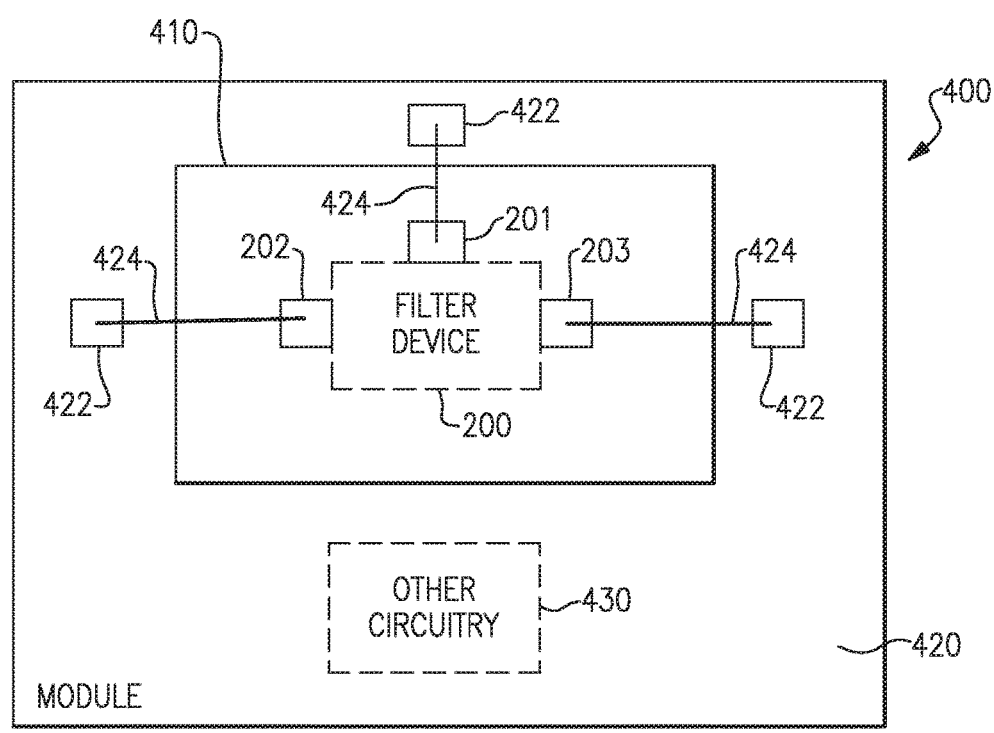
FIG. 9 is a block diagram of one example of a module including a filter device according to aspects of the present disclosure.

Embodiments of the filter device 200 can be incorporated into and packaged as a module that may ultimately be used in an electronic device, such as a wireless communications device, for example. FIG. 9 is a block diagram illustrating one example of a module 400 including the filter device 200. The filter device 200 may be implemented on one or more die(s) 410 including one or more connection pads. In the example shown in FIG. 9, the filter device 200 includes at least three connection pads corresponding to the common contact 201, the first signal contact 202, and the second signal contact 203. The packaged module 400 includes a packaging substrate 420 that is configured to receive a plurality of components, including the filter device die 410. A plurality of connection pads 422 can be disposed on the packaging substrate 420, and the various connection pads of the filter device die 410 can be connected to the connection pads 422 on the packaging substrate 420 via electrical connectors 424, which can be solder bumps or wirebonds, for example, to allow for passing of various signals to and from the filter device 200. The module 400 may optionally further include other circuitry die 430, such as, for example one or more additional filter(s), amplifiers, pre-filters, modulators, demodulators, down converters, and the like, as would be known to one of skill in the art of semiconductor fabrication in view of the disclosure herein. In some embodiments, the module 400 can also include one or more packaging structures to, for example, provide protection and facilitate easier handling of the module 400. Such a packaging structure can include an overmold formed over the packaging substrate 420 and dimensioned to substantially encapsulate the various circuits and components thereon.

As discussed above, various examples and embodiments of the filter device 200 can be used in a wide variety of electronic devices. For example, the filter device 200 can be configured as an antenna duplexer or diplexer, which can be incorporated into a variety of electronic devices, such as RF front-end modules and communication devices.

Figure 10:
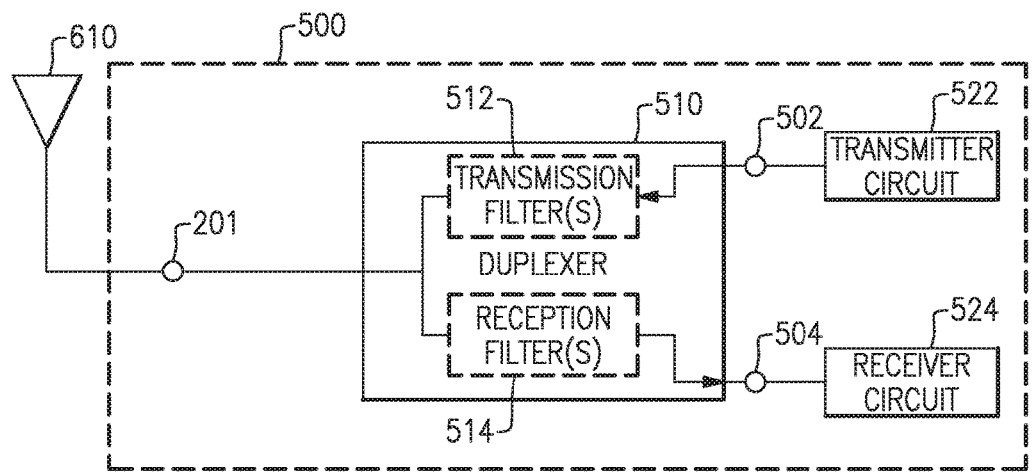
FIG. 10 is a block diagram of one example of an RF front-end module including a filter device configured as an antenna duplexer according to aspects of the present disclosure.

Referring to FIG. 10, there is illustrated a block diagram of one example of a front-end module 500, which may be used in an electronic device such as a wireless communications device (e.g., a mobile phone) for example. In this example, the filter device 200 is configured as an antenna duplexer 510 included in the front-end module 500. The antenna duplexer 510 includes the common contact 201, to which an antenna 610 is connected. The antenna duplexer 510 further includes an input signal contact 502 and an output signal contact 504.

The antenna duplexer 510 may include a transmission filter 512 connected between the input signal contact 502 and the common contact 201, and a reception filter 514 connected between the common contact 201 and the output signal contact 504. The passband(s) of the transmission filter(s) are different from the passband(s) of the reception filter(s). In this example, the transmission filter 512 may correspond to one of the first filter 210 and the second filter 220 in the filter device 200, and the reception filter 514 may correspond to the other of the first filter 210 and the second filter 220. Accordingly, the input and output signal contacts 502, 504 may correspond to respective ones of the first and second signal contacts 202, 203 of the filter device 200.

The front-end module 500 further includes a transmitter circuit 522 connected to the input signal contact 502 of the duplexer 510 and a receiver circuit 524 connected to the output signal contact 504 of the duplexer 510. The transmitter circuit 522 can generate signals for transmission via the antenna 610, and the receiver circuit 524 can receive and process signals received via the antenna 610. In some embodiments, the receiver and transmitter circuits are implemented as separate components, as shown in FIG. 10, however in other embodiments these components may be integrated into a common transceiver circuit or module. As will be appreciated by those skilled in the art, the front-end module 500 may include other components that are not illustrated in FIG. 10 including, but not limited to, switches, electromagnetic couplers, amplifiers, processors, and the like.

Figure 11:
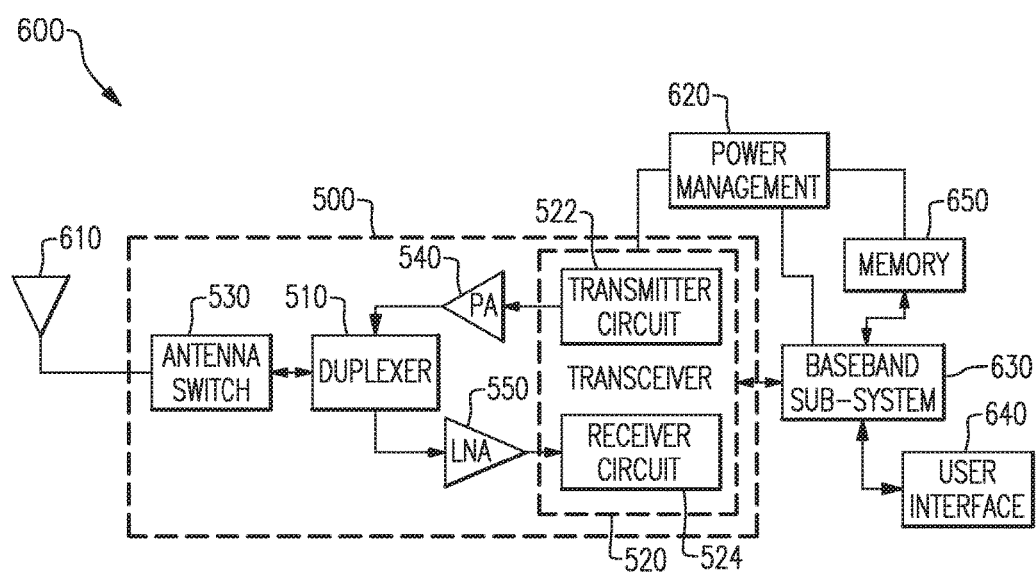
FIG. 11 is a block diagram of one example of a wireless device including a filter device configured as an antenna duplexer according to aspects of the present disclosure.

FIG. 11 is a block diagram of one example of a wireless device 600 including the antenna duplexer 510 shown in FIG. 10. The wireless device 600 can be a cellular phone, smart phone, tablet, modem, communication network or any other portable or non-portable device configured for voice or data communication. The wireless device 600 can receive and transmit signals from the antenna 610. The wireless device includes an embodiment of a front-end module 500 similar to that discussed above with reference to FIG. 10. The front-end module 500 includes the duplexer 510, as discussed above. In the example shown in FIG. 11 the front-end module 500 further includes an antenna switch 530, which can be configured to switch between different frequency bands or modes, such as transmit and receive modes, for example. In the example illustrated in FIG. 11, the antenna switch 530 is positioned between the duplexer 510 and the antenna 610; however, in other examples the duplexer 510 can be positioned between the antenna switch 530 and the antenna 610. In other examples the antenna switch 530 and the duplexer 510 can be integrated into a single component.

The front-end module 500 includes a transceiver 520 that is configured to generate signals for transmission or to process received signals. The transceiver 520 can include the transmitter circuit 522, which can be connected to the input signal contact 502 of the duplexer 510, and the receiver circuit 524, which can be connected to the output signal contact 504 of the duplexer 510, as shown in the example of FIG. 10.

Signals generated for transmission by the transmitter circuit 522 are received by a power amplifier (PA) module 540, which amplifies the generated signals from the transceiver 520. The power amplifier module 540 can include one or more power amplifiers. The power amplifier module 540 can be used to amplify a wide variety of RF or other frequency-band transmission signals. For example, the power amplifier module 540 can receive an enable signal that can be used to pulse the output of the power amplifier to aid in transmitting a wireless local area network (WLAN) signal or any other suitable pulsed signal. The power amplifier module 540 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 540 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 11, the front-end module 500 may further include a low noise amplifier module 550, which amplifies received signals from the antenna 610 and provides the amplified signals to the receiver circuit 524 of the transceiver 520.

The wireless device 600 of FIG. 11 further includes a power management sub-system 620 that is connected to the transceiver 520 and manages the power for the operation of the wireless device 600. The power management system 620 can also control the operation of a baseband sub-system 630 and various other components of the wireless device 600. The power management system 620 can include, or can be connected to, a battery (not shown) that supplies power for the various components of the wireless device 600. The power management system 620 can further include one or more processors or controllers that can control the transmission of signals, for example. In one embodiment, the baseband sub-system 630 is connected to a user interface 640 to facilitate various input and output of voice and/or data provided to and received from the user. The baseband sub-system 630 can also be connected to memory 650 that is configured to store data and/or instructions to facilitate the operation of the wireless device 600, and/or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. It is to be appreciated that embodiments of the methods and apparatuses discussed herein are not limited in application to the details of construction and the arrangement of components set forth in the description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation Accordingly, the foregoing description and drawings are by way of example only, and the scope of the invention should be determined from proper construction of the appended claims, and their equivalents.

What is claimed is:

1. A filter device comprising:
   a common contact, a first signal contact, and a second signal contact;
   a first filter connected between the common contact and the first signal contact and having a first passband, the first filter including a first piezoelectric substrate, a surface acoustic wave (SAW) filter formed on a surface of the first piezoelectric substrate, a first SAW resonator formed on the surface of the first piezoelectric substrate and connected in series between the common contact and the SAW filter, and a dielectric film formed over the surface of the piezoelectric substrate and covering the SAW filter and the first SAW resonator, the dielectric film having a first thickness in a first region corresponding to the SAW filter and a second thickness in a second region corresponding to the first SAW resonator, the first thickness being greater than the second thickness; and
   a second filter connected between the common contact and the second signal contact and having a second passband different from the first passband, a difference between the first thickness and the second thickness of the dielectric film being selected to suppress spurious emissions in the second passband generated by propagation of a Lamb wave in the first region of the dielectric film.

2. The filter device of claim 1 wherein a center frequency of the second passband is in a range of 1.2 to 1.4 times greater than a center frequency of the first passband.

3. The filter device of claim 2 wherein the center frequency of the second passband is in a range of 1.25 to 1.3 times greater than the center frequency of the first passband.

4. The filter device of claim 1 wherein the first SAW resonator and the SAW filter together form a ladder-type filter, the SAW filter including a plurality of series SAW resonators connected in series between the first signal contact and the first SAW resonator and a plurality of parallel SAW resonators connected to at least one ground contact.

5. The filter device of claim 1 wherein the dielectric film is made of silicon dioxide.

6. The filter device of claim 1 wherein the second thickness of the dielectric film in the second region corresponding to the first SAW resonator is configured to be less than 26% when normalized with a wavelength of an excited surface acoustic wave in the first filter.

7. The filter device of claim 6 wherein the first thickness of the dielectric film in the first region corresponding to the SAW filter is configured to be greater than 29% when normalized with the wavelength of the excited surface acoustic wave in the first filter.

8. The filter device of claim 1 wherein the first piezoelectric substrate is made of one of lithium niobate and lithium tantalate.

9. The filter device of claim 1 wherein the second filter includes a plurality of acoustic wave elements disposed on the first piezoelectric substrate.

10. The filter device of claim 1 wherein the second filter includes a second piezoelectric substrate and a plurality of acoustic wave elements disposed on the second piezoelectric substrate.

11. The filter device of claim 10 wherein the plurality of acoustic wave elements includes at least one of surface acoustic wave elements, bulk acoustic wave elements, and thin-film bulk acoustic resonators.

12. The filter device of claim 10 wherein the first piezoelectric substrate is made of a first material and the second piezoelectric substrate is made of a second material different from the first material.

13. The filter device of claim 1 wherein an antiresonant frequency of the first SAW resonator is higher in frequency than an attenuation pole located closest to a higher-frequency side of the first passband.

14. A filter device comprising:
   a common contact, a first signal contact, and a second signal contact;
   a first filter connected between the common contact and the first signal contact and having a first passband, the first filter including a first piezoelectric substrate, a surface acoustic wave (SAW) filter formed on a surface of the first piezoelectric substrate and configured to excite a surface acoustic wave, a first SAW resonator formed on the surface of the first piezoelectric substrate and connected in series between the common contact and the SAW filter, and a dielectric film formed over the surface of the piezoelectric substrate and covering the SAW filter and SAW resonator, the dielectric film having a first thickness in a first region corresponding to the SAW filter and a second thickness in a second region corresponding to the SAW resonator, the first thickness being be greater than 29% when normalized with a wavelength of the surface acoustic wave, and the second thickness being less than 26% when normalized with the wavelength of the surface acoustic wave; and a second filter connected between the common contact and the second signal contact and having a second passband different from the first passband.

15. The filter device of claim 14 wherein a center frequency of the second passband is in a range of 1.2 to 1.4 times greater than a center frequency of the first passband.

16. The filter device of claim 15 wherein the center frequency of the second passband is in a range of 1.25 to 1.3 times greater than the center frequency of the first passband.

17. The filter device of claim 14 wherein the dielectric film is made of silicon dioxide.

18. The filter device of claim 14 wherein the second filter includes a plurality of acoustic wave elements disposed on the first piezoelectric substrate.

19. The filter device of claim 14 wherein the second filter includes a second piezoelectric substrate and a plurality of acoustic wave elements disposed on the second piezoelectric substrate.

20. The filter device of claim 19 wherein the first piezoelectric substrate is made of a first material and the second piezoelectric substrate is made of a second material different from the first material.

* * * * *

UNITED STATES PATENT AND TRADEMARK OFFICE
CERTIFICATE OF CORRECTION

PATENT NO. : 10,491,194 B2
APPLICATION NO. : 16/247646
DATED : November 26, 2019
INVENTOR(S) : Tomoya Komatsu et al.

Page 1 of 1

It is certified that error appears in the above-identified patent and that said Letters Patent is hereby corrected as shown below:

On the Title Page

(72) Inventors: delete "Joji Fujiwara, Suita (JP)" and insert -- Joji Fujiwara, Suita-Shi (JP) --

Signed and Sealed this
Twenty-first Day of January, 2020

Andrei Iancu
*Director of the United States Patent and Trademark Office*